(12) United States Patent
Lin et al.

(10) Patent No.: US 6,274,448 B1
(45) Date of Patent: *Aug. 14, 2001

(54) METHOD OF SUPPRESSING JUNCTION CAPACITANCE OF SOURCE/DRAIN REGIONS

(75) Inventors: Tony Lin, Kaohsiung Hsien; Wen-Kuan Yeh, Chupei; Jih-Wen Chou, Hsinchu, all of (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/208,621

(22) Filed: Dec. 8, 1998

(51) Int. Cl.$^7$ .................................................. H01L 21/336
(52) U.S. Cl. ............................................ 438/305; 438/302
(58) Field of Search ................................. 438/305, 231, 438/220, 202, 302

(56) References Cited

U.S. PATENT DOCUMENTS

| | | | |
|---|---|---|---|
| 4,703,551 | * 11/1987 | Szluk et al. | 437/30 |
| 4,744,859 | * 5/1988 | Hu et al. | 437/29 |
| 4,818,714 | * 4/1989 | Haskell | 437/44 |
| 4,889,825 | * 12/1989 | Parrillo | 437/34 |
| 4,956,311 | * 9/1990 | Liou et al. | 437/44 |
| 4,963,504 | * 10/1990 | Huang | 437/44 |
| 5,015,595 | * 5/1991 | Wollesen | 437/31 |
| 5,100,815 | * 3/1992 | Tsubone et al. | 437/34 |
| 5,340,760 | * 8/1994 | Komori et al. | 437/43 |
| 5,409,848 | * 4/1995 | Han et al. | 437/35 |
| 5,888,861 | * 3/1999 | Chien et al. | 438/202 |

* cited by examiner

*Primary Examiner*—John F. Niebling
*Assistant Examiner*—Walter L. Lindsay, Jr.

(57) ABSTRACT

A method of suppressing junction capacitance of the source/drain regions is disclosed in this invention. The source/drain regions are formed by double implantation of phosphorus ions and arsenic ions. The phosphorus ion implantation lowers the energy needed in the implantation of arsenic ions, and reduces dislocations in the source/drain regions formed during implanting arsenic ions. Further, the double implantation suppresses the junction profile of arsenic ions, and enhances the width of depletion regions. So, the junction capacitance is reduced, thereby accelerate the function of semiconductor devices.

17 Claims, 3 Drawing Sheets

METHOD OF SUPPRESSING JUNCTION CAPACITANCE OF SOURCE/DRAIN REGIONS

BACKGROUND OF THE INVENTION

1. Field of the Invention

This invention relates to a method of suppressing junction capacitance of source/drain regions, and more particularly to a method of forming the source/drain regions by double implantation.

2. Description of the Related Art

The functioning speed of a transistor can be speed up by shortening channel length while downsizing the MOS devices. The Lightly Doped Drain (LDD) structure is widely used for solving the problem of abnormal function or even dysfunction of a transistor caused by the Short Channel Effect (SCE) and the Hot Electron Effect (HEE) that occur when the channel length is overly shortened. In the method of forming source/drain regions by only one ion implantation step, arsenic ions are widely used. Because arsenic ions are similar to silicon ions in radius, fewer dislocations will be formed when arsenic ions are doped into a silicon substrate. However, as the doping energy increases, dislocations occur even using arsenic ions as dopants.

FIGS. 1A–1B are cross-sectional views illustrating the fabrication of a MOS transistor in accordance with the prior art;

As shown in FIG. 1A, thermal oxidation is used to form a gate oxide layer 11 on the substrate 10, followed by subsequent deposition of polysilicon and tungsten silicide, after which a gate 12 is defined. Using the gate 12 as a mask, arsenic ions are implanted into the substrate 10 to form a lightly doped drain. The substrate 10 is then placed in a thermal diffusion oven to form the lightly doped regions 16.

As shown in FIG. 1B, silicon dioxide is deposited by chemical vapor deposition (CVD) to cover the substrate 10 and the gate 12. Portions of the silicon dioxide layer are then etched back to form spacers 14 on the sidewalls of the gate 12.

Referring to FIG. 1C, arsenic ions are heavily and deeply implanted into the substrate while using the gate 12 and the spacers 14 as a mask. The wafer is then annealed to form source/drain regions 18. Typically, the source/drain regions 18 have a different conductive type from conductive type of the substrate 10. As the source/drain regions 18 are formed in contact with the substrate 10, a P-N junction is formed. At P-N junction, holes from P-side diffuse into the N-side, while electrons from N-side diffuse into the P-side. As a consequence, an internal field is built, and a depletion region is formed. The depletion region is electrically neutral. The depletion region plays a role as a dielectric layer within two electrodes, and this structure causes the junction capacitance.

The junction capacitance depends on the width of depletion regions, and the width of depletion regions is related to the junction profile of the implanted ions in the substrate. Because of the abrupt junction profile of arsenic ions, the width of the depletion region is narrow, and the junction capacitance become large. In other words, the high-energy implanted arsenic ions create defects in the silicon crystal structure of the substrate and this causes some leakage in the source/drain regions 18.

SUMMARY OF THE INVENTION

It is therefore an object of the invention to provide an improved method of suppressing the junction capacitance in the source/drain regions. A lightly and deeply phosphorus ions implantation followed by another arsenic implantation to the source/drain regions is performed to suppress the junction profile of arsenic ions between the source/drain regions and the well. The suppression of the junction profile of arsenic ions increases the width of the depletion regions, reduces the junction capacitance, and in this manner increases the functioning speed of semiconductor devices. Further more, phosphorus ion implantation lower the energy needed in the arsenic ion implantation and reduces the defects formed in the substrate surface by ion bombardments.

To achieve these objects and advantages, and in accordance with the purpose of the invention, as embodied and broadly described herein, the invention is directed towards a method of suppressing junction capacitance of the source/drain regions. First, a gate oxide layer is formed on a substrate, followed by formation of a polysilicon layer on the gate oxide layer, after which the gate structure is defined. With the gate as a mask, low-dosage arsenic ions are implanted into the substrate to form the lightly doped regions. An insulating layer is deposited over the substrate and covers the gate, after which portions of the insulating layer are dry etched to form spacers on the sidewalls of the gate. Phosphorus ions are implanted into the substrate using the gate and spacers as a mask, and then the other ion implantation with arsenic ions is performed. The doped arsenic and phosphorus ions reach uniform distributions in the source/drain regions by a thermal process, and fabrication of the transistor is finished.

It is to be understood that both the foregoing general description and the following detailed description are exemplary and explanatory only and are not restrictive of the invention, as claimed.

DESCRIPTION OF THE PREFERRED EMBODIMENTS

FIGS. 2A–2D are schematic, cross-sectional views illustrating the fabrication steps of a transistor of the preferred embodiment according to the invention.

Figure 1A:
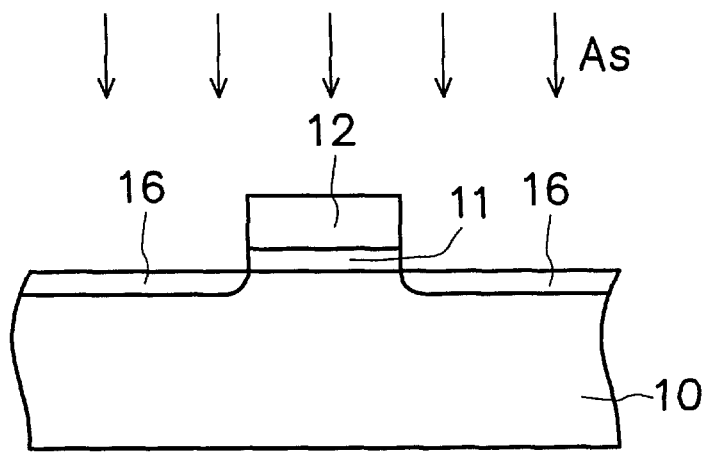
FIG. 1A–1C are schematic, cross-sectional views illustrating the fabrication steps of a transistor in accordance with a method known in the prior art.
Figure 1B:
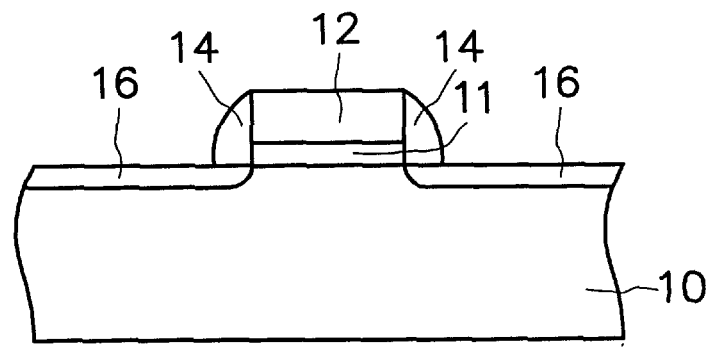
Figure 1C:
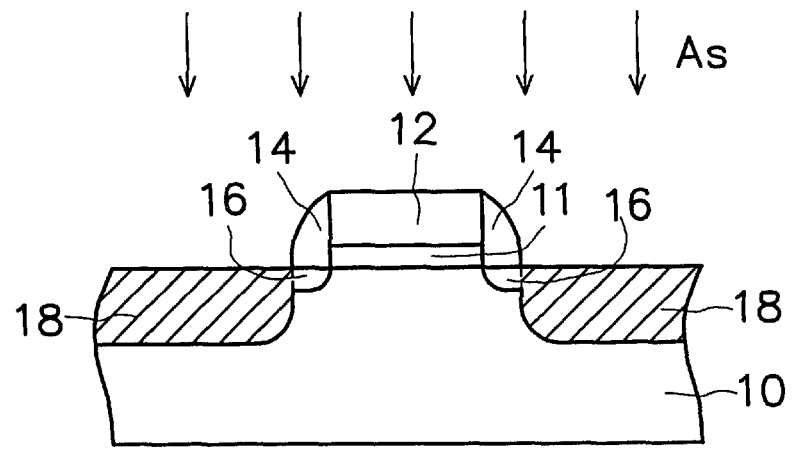
Figure 2A:
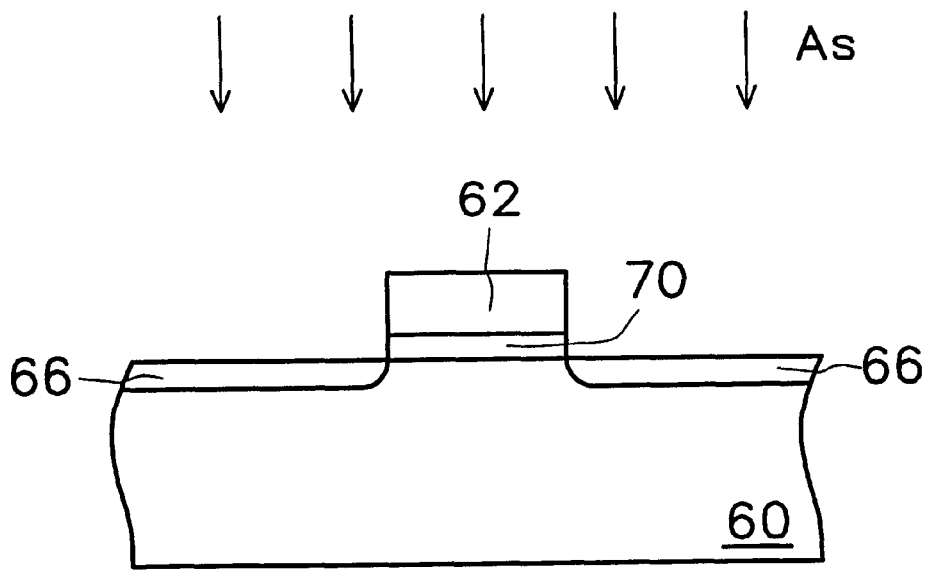
FIGS. 2A–2D are schematic, cross-sectional views illustrating the fabrication steps of a transistor of preferred embodiment according to the invention.

Referring to FIG. 2A, the gate oxide layer 70 is formed on the substrate 60 by a thermal oxidation method, which is followed by depositing polysilicide and tungsten silicide by, for example, Low Pressure Chemical Vapor Deposition (LPCVD), and patterning the gate 62.

Figure 2B:
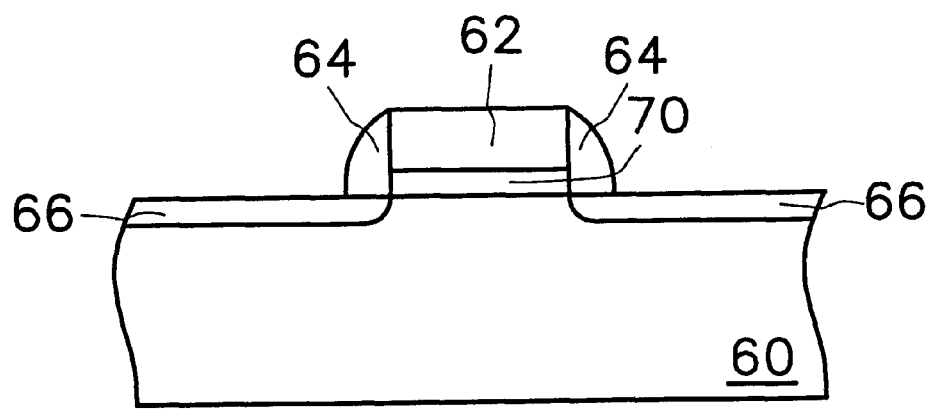

As shown in FIG. 2B, lightly doped regions 66 are formed by a lower-dosage implanting process into the substrate 60, using the gate 62 as mask.

Figure 2C:
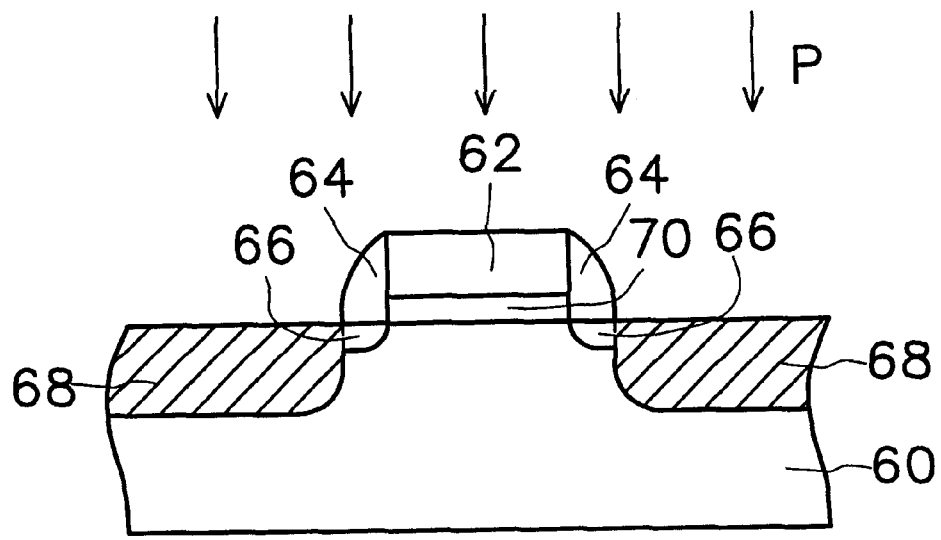

Referring to FIG. 2C, insulating material such as silicon dioxide is deposited by LPCVD, for example, to cover the substrate 60 and the gate 62. Portions of the insulating material are removed by dry etching to form the spacers 64 on the sidewalls of the gate 62. N-type ions are implanted into the substrate 60 to form the N-type doped regions 68, with a dopant such as phosphorus hydrogen ($PH_3$), with a dosage of $10^{13}$ to $10^{14}/cm^2$ and an implanting energy of about 30 to 50 Kev, for example. Implanting phosphorus ions into the substrate 60 will reduce the energy needed in the following implantation and so forth fewer dislocations will be formed.

Figure 2D:
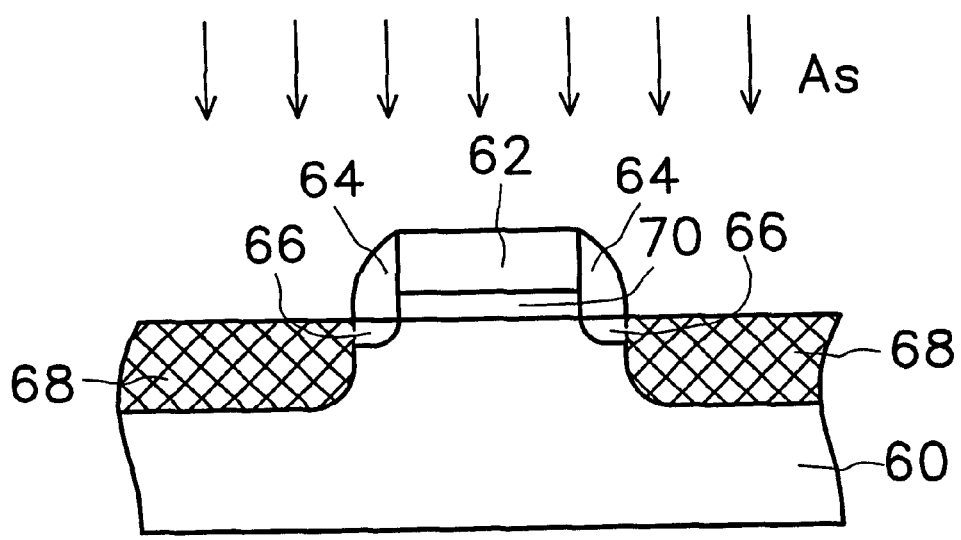

As shown in FIG. 2D, the other N-type ions are implanted into the substrate 60 using the gate 62 and the spacers 64 as a mask, with a dopant such as arsenic ions and with a dosage of about $1\times10^{15}$ to $4\times10^{15}/cm^2$ and an implantation energy of about 20 to 60 Kev. The source/drain regions 72 are formed after the diffusion of N-type ions caused by a thermal process such as Rapid Thermal Annealing (RTA). An important character of the invention is source/drain regions formed by double implantation of N-type ions.

According to the embodiment mentioned above, this invention has the following advantages:

1. The energy needed in the implantation of arsenic ions is lowered by the implantation of phosphorus ions that preformed earlier. Implanting arsenic ions into the substrate with lower energy reduces dislocations created during the arsenic ion implantation.

2. The implantation of phosphorus ions suppresses the abrupt junction profile of arsenic ions in the source/drain regions, increases the width of depletion regions, and reduces the junction capacitance, therefore shortening the RC delay time.

The method of suppressing junction capacitance of source/drain regions by double implantation can be used in forming PMOS, too. In PMOS, the junction capacitance can be suppressed by double implantation of boron ions. There is no dislocation problem in PMOS, and the junction profile of doped ions in the substrate is suppressed by double implantation of P-type ions. Thus, the junction capacitance is reduced and the functioning speed of PMOS is enhanced.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of suppressing junction capacitance of source/drain regions, comprising:

forming a gate structure on a substrate;

forming an LDD structure in the substrate;

forming spacers on a sidewall of the gate structure subsequent to the formation of the LDD structure;

performing a phosphorus ion implanting step to form a heavily doped portion of a source/drain region in the substrate using the spacer and the gate structure as masks; and performing an arsenic ion implanting step to complete forming the heavily doped portion of the source/drain region in the substrate.

2. The method according to claim 1, wherein the arsenic ion implanting step further includes a thermal process which is performed by rapid thermal annealing.

3. The method according to claim 1, wherein the dosage of the phosphorus ion implanting step is about $10^{13}$ to $10^{14}/cm^2$.

4. The method according to claim 1, wherein the implanting energy used in the phosphorus ion implanting step is about 30 to 50 Kev.

5. The method according to claim 1, wherein the dosage of the arsenic ion implanting step is about $1\times10^{15}$ to $4\times10^{15}/cm^2$.

6. The method according to claim 1, wherein the implanting energy used in the arsenic ion implanting step is about 20 to 60 Kev.

7. A method of suppressing junction capacitance of source/drain regions in NMOS, comprising:

forming a LDD structure in a P-type substrate;

performing one N-type ion implanting step to form a heavily doped portion of a source/drain region in the substrate subsequent to the formation of the LDD structure;

performing the other N-type ion implanting step to complete forming the heavily doped portion of the source/drain region on the substrate.

8. The method according to claim 7, wherein the N-type ions comprise phosphorus ions.

9. The method according to claim 7, wherein the other N-type ions comprise arsenic ions.

10. The method according to claim 7, wherein the other N-type ion implanting step further includes a thermal process performed by rapid thermal annealing.

11. The method according to claim 7, wherein the method of suppressing junction capacitance of the source/drain regions in NMOS further includes forming a gate structure on the substrate before forming the LDD structure.

12. The method according to claim 11, wherein the method of suppressing junction capacitance of the source/drain regions in NMOS further includes forming spacers on sidewalls of the gate structure after forming the LDD structure.

13. A method of suppressing junction capacitance of source/drain regions in PMOS, comprising:

forming a LDD structure in a N-type substrate;

performing one P-type ion implanting step to form a heavily doped portion of a source/drain region structure in the substrate subsequent to the formation of the LDD structure;

Performing the other P-type ion implanting step to complete forming the heavily doped portion of the source/drain structure in the substrate.

14. The method according to claim 13, wherein the P-type ions comprise boron ions.

15. The method according to claim 13, wherein the other P-type ion implanting step further includes a thermal process performed by rapid thermal annealing.

16. The method according to claim 13, wherein the method of suppressing junction capacitance of the source/drain regions in PMOS further includes forming a gate structure on the substrate.

17. The method according to claim 16, wherein the method of suppressing junction capacitance of the source/drain regions in PMOS further includes forming spacers on sidewalls of the gate structure.

\* \* \* \* \*